(12) United States Patent
Fujita et al.

(10) Patent No.: US 8,206,841 B2
(45) Date of Patent: Jun. 26, 2012

(54) MOISTURE-REACTIVE COMPOSITION AND ORGANIC ELECTROLUMINESCENT DEVICE

(75) Inventors: Jun Fujita, Tokyo (JP); Takashi Yamasaki, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 548 days.

(21) Appl. No.: 12/374,096

(22) PCT Filed: Aug. 28, 2007

(86) PCT No.: PCT/US2007/076946
§ 371 (c)(1),
(2), (4) Date: Jan. 16, 2009

(87) PCT Pub. No.: WO2008/027863
PCT Pub. Date: Mar. 6, 2008

(65) Prior Publication Data
US 2010/0001634 A1    Jan. 7, 2010

(30) Foreign Application Priority Data

Aug. 31, 2006  (JP) .................. 2006-235590

(51) Int. Cl.
*H01L 51/54* (2006.01)
*C08K 5/56* (2006.01)

(52) U.S. Cl. ........ 428/690; 428/917; 313/502; 313/504; 524/175; 524/176

(58) Field of Classification Search .................. None
See application file for complete search history.

(56) References Cited

U.S. PATENT DOCUMENTS

| | | | |
|---|---|---|---|
| 4,822,350 A * | 4/1989 | Ito et al. ................ | 604/372 |
| 5,107,175 A * | 4/1992 | Hirano et al. ............ | 313/512 |
| 5,684,079 A | 11/1997 | Yumoto et al. | |
| 5,882,761 A | 3/1999 | Kawami et al. | |
| 6,226,890 B1 * | 5/2001 | Boroson et al. ........... | 34/472 |
| 6,465,953 B1 | 10/2002 | Duggal | |
| 7,244,779 B2 | 7/2007 | Tung et al. | |
| 7,923,480 B2 * | 4/2011 | Fujita et al. .............. | 522/81 |
| 2002/0015818 A1 | 2/2002 | Takahashi et al. | |
| 2005/0227114 A1 | 10/2005 | Tanaka et al. | |
| 2005/0276947 A1 | 12/2005 | Huang et al. | |
| 2006/0022592 A1 * | 2/2006 | Boroson ................... | 313/512 |
| 2006/0189738 A1 | 8/2006 | Ueda et al. | |

FOREIGN PATENT DOCUMENTS

| | | |
|---|---|---|
| EP | 0 414 258 | 2/1991 |
| JP | 07-169567 | 7/1995 |
| JP | 2001-357973 | 12/2001 |
| JP | 2003-142256 | 5/2003 |
| JP | 2005190934 | 7/2005 |

OTHER PUBLICATIONS

Supplementary European Search Report, EP Application No. 07814488 Apr. 4, 2011.

* cited by examiner

*Primary Examiner* — Lynda M Salvatore
*Assistant Examiner* — Andrew K Bohaty

(57) ABSTRACT

There is provided a moisture-reactive composition comprising a moisture-reactive organometallic compound, and a polymer having a carboxyl group at the end of a main chain or a side chain. A moisture-absorbing film formed of the moisture-reactive composition is also provided. An organic electroluminescent device comprising the moisture-reactive composition is also provided wherein a laminate is formed by interposing an organic luminescent material layer made of an organic material between a pair of electrodes facing each other, and a structure shields the laminate from the outside air, and drying means are arranged in the structure, wherein the drying means is formed of the moisture-reactive composition.

22 Claims, 2 Drawing Sheets

MOISTURE-REACTIVE COMPOSITION AND ORGANIC ELECTROLUMINESCENT DEVICE

BACKGROUND

The present invention relates to a moisture-reactive composition which can form a transparent and flexible moisture absorbing layer, and an organic electroluminescence (hereinafter abbreviated to EL) device including drying means formed of the composition.

An organic EL device utilizing an organic material has attracted special interest as a light emitting device capable of emitting light with high luminance due to DC drive at low voltage, the light emitting device comprising an anode, a cathode and an organic layer formed between the anode and the cathode, the organic layer comprising an organic charge transporting layer and an organic light emitting layer laminated with each other. Also this organic EL device is expected as a flexible display because the entire material can be composed of a solid.

On the other hand, the organic EL device has such a problem that when the organic EL device is driven for a fixed period, light emitting characteristics such as light emitting luminance, luminous efficiency and luminous uniformity drastically deteriorate as compared with the case of an initial stage. Examples of the cause of deterioration of these light emitting characteristics include oxidation of electrodes caused by oxygen penetrated into the organic EL device, oxidative decomposition of an organic material caused by heat generation during driving, and denaturation of an organic matter. The cause of deterioration of light emitting characteristics further includes mechanical deterioration of a structure, for example, peeling of the interface of the structure is caused by an influence of oxygen and moisture and also heat generation during driving and high-temperature environment trigger generation of stress at the interface of the structure due to a difference in a thermal expansion coefficient of the respective components, resulting in peeling of the interface.

To prevent these problems, there have been studied various techniques of sealing an organic EL device in order to inhibit contact with moisture and oxygen. For example, as shown in FIG. 1, there is disclosed a method of preventing arrival of moisture at an organic EL device by putting a sealing cap 2 with a water absorbing agent 6 adhered on the inner wall on a picture element area including a substrate 1 and the organic EL device comprising a transparent electrode 3, an organic functional layer 4 and a metal cathode electrode 5 formed on the substrate, filling the inside with a nitrogen gas 9, and fixing the sealing cap on the substrate 1 using an adhesive 7 (see, for example, Japanese Unexamined Patent Publication (Kokai) No. 9-148066). Also there is disclosed a method of reducing an influence of oxygen by using an oxygen absorbing agent in place of the water absorbing agent (see, for example, Japanese Unexamined Patent Publication (Kokai) No. 7-169567).

Various substances have been studied as water absorbing agents. Among various substances, alkali earth metal oxides such as barium oxide (BaO) or calcium oxide (CaO) have widely been studied because they can certainly capture water molecules by the chemical reaction and do not release water molecules at high temperature, unlike water absorbing agents such as silica gel or zeolite which physically adsorb water.

However, these water absorbing agents have drawbacks because they are particles of an inorganic compound and require a concave substrate so as to adhere in the device and therefore the resulting device is thick. Also, alkali earth metal oxides are opaque and therefore can be applied to a so-called bottom emission type display device in which display light is taken out from the side of the substrate 1. However, when the alkali earth metal oxide is applied to a so-called top emission type display device in which display light is to be emitted from the side of the sealing cap 2 opposite the substrate 1, emission of light is obstructed by the water absorbing agent 4, and therefore the water absorbing agent 4 must be arranged so as not to enter in the image picture area and an installation location must be provided.

Some proposals have been made for applying water absorbing agents to top emission type display devices. For example, it can be easily considered to apply polymers such as polyvinyl alcohol and nylon, which are transparent and have water absorbing properties, as the water absorbing agent. However, these polymers physically adsorb water and do not have sufficient water absorbing properties as described above. It is also proposed to use a particulate water absorbing agent arranged so as not to adversely affect light transmission properties in a top emission type structure (see, for example, Japanese Unexamined Patent Publication (Kokai) No. 2001-357973). It is also proposed to use a plastic substrate in which a water absorbing agent having a particle size smaller than an emission wavelength of the organic EL device is dispersed (see, for example, Japanese Unexamined Patent Publication (Kokai) No. 2002-56970). However, inorganic particles are difficult to arrange and uniformly disperse as primary particles, and thus deterioration of transmission caused by light scattering cannot be avoided.

As means for solving these problems, the use of a water capturing film which absorbs less visible light, but has sufficient transparency, has been proposed (see Japanese Unexamined Patent Publication (Kokai) No. 2003-142256). This water capturing film can be formed by coating a special metal compound dissolved in a solvent. However, when applied to a flexible substrate, the water capturing film is insufficient in flexibility because the water capturing film is made of a low molecular weight compound. After moisture absorption, the compound becomes more brittle and may adhere on the organic EL device as a dust.

SUMMARY

The present invention has been made so as to solve the problems described above. An object of the present invention is to provide a composition which can be used as a moisture scavenger of a device such as organic EL device, that is likely to be influenced by moisture or oxygen, and is transparent and can be arranged at the side of the light receiving surface without intercepting light, and also has flexibility and can be applied to a flexible substrate. Another object of the present invention is to provide an organic EL device which maintains light emitting characteristics for a long period.

To achieve the objects described above, there is provided a moisture-reactive composition comprising: a moisture-reactive organometallic compound comprising Al, Mg, Zn, Ti or Zr; and a polymer having a molecular weight of from 500 to 5,000,000, the polymer comprising carboxylic acid groups and selected from the group consisting of: (a) an acrylic polymer comprising one or more acrylic monomers selected from the group consisting of (meth)acrylic acid; styrene; α-methylstyrene; 2-ethylhexyl (meth)acrylate; n-octyl (meth)acrylate; lauryl (meth)acrylate; stearyl (meth)acrylate; isobornyl (meth)acrylate; dicyclopentanyl (meth)acrylate; phenoxyethyl (meth)acrylate; polyethylene glycol (meth) acrylate; polypropylene glycol (meth)acrylate; N-methylol (meth)acrylamide; N-methoxymethyl (meth)acrylamide; N-ethoxymethyl (meth)acrylamide; N-n-butoxymethyl (meth)acrylamide; N-isobutoxymethyl (meth)acrylamide; t-butyl (meth)acrylamide; octyl (meth)acrylamide; acryloyl morpholine; N-vinyl pyrrolidone; N,N-dimethyl (meth)acrylamide; N,N-diethyl (meth)acrylamide; N-(2-hydroxyethyl) (meth)acrylamide; and N,N-dimethylaminopropyl (meth) acrylamide; (b) a silicone; (c) polyether; and (d) a hydrogenated polyolefin. A moisture-absorbing film formed of the moisture-reactive composition is also provided.

To achieve the objects described above, there is also provided an organic EL device comprising the moisture-reactive composition. The organic EL device comprises a laminate formed by interposing an organic luminescent material layer made of an organic material between a pair of electrodes facing each other, and a structure shields the laminate from the outside air, and drying means are arranged in the structure, wherein the drying means is formed of the moisture-reactive composition.

DETAILED DESCRIPTION

Figure 1:
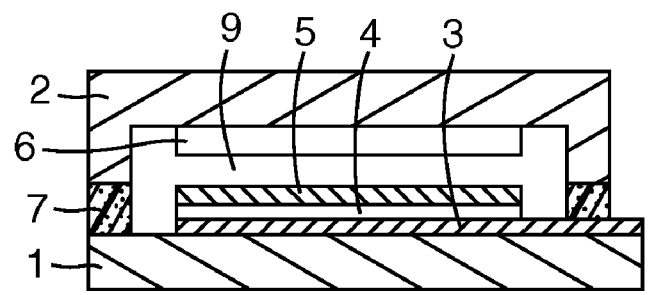
FIG. 1 is a sectional view showing schematically a structure of an organic EL device of the present invention and the prior art.

As described above, the moisture-reactive composition of the present invention contains a reaction product of:
a moisture-reactive organometallic compound, and
a polymer having a carboxyl group at the end of a main chain or a side chain.

The moisture-reactive organometallic compound is a compound which can react with water, thereby removing moisture due to a chemical reaction. This moisture-reactive organometallic compound partially reacts with a polymer having a carboxyl group as the other component constituting the composition, thereby being fixed and imparting reactivity with water and oxygen to the polymer having a carboxyl group. Furthermore, since this moisture-reactive organometallic compound does not produce a corrosive compound when reacted with water, a problem such as corrosion does not arise at the applied site.

This moisture-reactive organometallic compound is preferably a compound represented by the following formula:

$$MR_n$$

wherein M represents Al, Mg, Zn, Ti or Zr; R independently represents a substituted or unsubstituted alkyl, alkenyl or alkoxy group; and n represents a valence of M.

In the above formula, M is more preferably Al or Ti. R is more preferably a methyl group, an ethyl group, a propyl group, a butyl group, a hexyl group, an octyl group, a methoxy group, an ethoxy group, a butoxy group, a hexyloxy group, a cyclohexyloxy group, an octyloxy group, a 2-ethylhexyloxy group, an isostearyloxy group, an isoborneoxy group, a cholesteroxy group, a polyoxyethylene monomethyl ether oxy group, a polyoxypropylene monobutyl ether oxy group, a polytetrahydrofuran monomethyl ether oxy group, or an alkoxyl group having a polydimethylsiloxane skeleton, and more preferably a hexyl group, an octyl group, an octyloxy group, a 2-ethylhexyloxy group, an isostearyloxy group, a polyoxyethylene monomethyl ether oxy group, a polyoxypropylene monobutyl ether oxy group, a polytetrahydrofuran monomethyl ether oxy group, or an alkoxyl group having a polydimethylsiloxane skeleton. Specific examples of the alkoxyl group having a polydimethylsiloxane skeleton include FM2221, FM2241 and FM2245 manufactured by Chisso Corporation.

Specific examples of the moisture-reactive organometallic compound include trimethylaluminum, triethylaluminum, trioctylaluminum, alkylaluminum compound, sesqui compound as a derivative thereof, tris(triethylene glycol monobutylether oxy)aluminum, triisostearyloxy aluminum, and organic aluminum compound such as alumoxane.

The polymer having a carboxyl group at the end of a main chain or a side chain can react with the moisture-reactive organometallic compound, thereby fixing the moisture-reactive organometallic compound and controlling reactivity, fluidity, flexibility and compatibility. This polymer having a carboxyl group may be represented by the following formula:

$$Y\text{-}(A)_m\text{-}Y$$

wherein A each independently represents $CH_2CR'COOY$, $CH_2CR'CONY_2$, $Si(R')(Y)O$, $CH_2CHR'O$ or $CH_2CHR'$; R' represents hydrogen or an alkyl group; Y represents hydrogen, an alkyl group or a carboxyalkyl group; and m represents an integer which satisfies the following relation: $10 \leq m \leq 10,000$.

In this polymer, the carboxyl group may be present at both ends, one end and a side chain in a molecule, and the number of the carboxyl groups is preferably 3 or less in a molecule on average. In case of 3 or more, drastic gelation occurs when reacted with the moisture-reactive organometallic compound and it becomes difficult to handle. A weight average molecular weight of the polymer having a carboxyl group can be appropriately selected according to physical properties of the resulting composition, but is usually within a range from 500 to 5,000,000, and preferably from 1,000 to 1,000,000. When the average molecular weight is less than 500, it is difficult to impart sufficient flexibility to the composition. On the other hand, when the average molecular weight is more than 5,000,000, the viscosity of the solution increased and it may become difficult to handle. The average molecular weight means a styrene equivalent molecular weight determined using a gel permeation chromatography (GCP).

Specific examples of the polymer having a carboxyl group include silicones such as polydimethylsiloxane having a carboxyl group in the side chain (X-22-3701E, manufactured by Shin-Etsu Chemical Co., Ltd.) or polydimethylsiloxane having a carboxyl group at the end (X-22-162C, manufactured by Shin-Etsu Chemical Co., Ltd.); polyalkylene glycols such as polyethylene glycol biscarboxymethyl ether having a carboxyl group at the end; and polyolefins such as α,ω-polybutadienecarboxylic acid (C-1000, manufactured by Nippon Soda Co., Ltd.) or hydrogenated α,ω-polybutadienecarboxylic acid (CI-1000, manufactured by Nippon Soda Co., Ltd.).

A copolymer of a (meth)acrylic acid and an acrylic monomer is a particularly preferable polymer having a carboxyl group. As used herein, "(meth)acryl" means acryl or methacryl. Such a copolymer can be generally synthesized by radical polymerization of the corresponding monomer.

Examples of preferable monomer which is copolymerizable with (meth)acrylic acid include styrene-based monomers such as styrene or α-methylstyrene; alkyl (meth)acrylates such as 2-ethylhexyl (meth)acrylate, n-octyl (meth)acrylate, lauryl (meth)acrylate, stearyl (meth)acrylate, isobornyl (meth)acrylate, or dicyclopentanyl (meth)acrylate; alkylene (meth)acrylates such as phenoxyethyl (meth)acrylate, polyethylene glycol (meth)acrylate, or polypropylene glycol (meth)acrylate; and acrylamides such as N-methylol (meth)acrylamide, N-methoxymethyl (meth)acrylamide, N-ethoxymethyl (meth)acrylamide, N-n-butoxymethyl (meth)acrylamide, N-isobutoxymethyl (meth)acrylamide, t-butyl (meth)acrylamide, octyl (meth)acrylamide, acryloyl morpholine, N-vinyl pyrrolidone, N,N-dimethyl (meth)acrylamide, N,N-diethyl (meth)acrylamide, N-(2-hydroxyethyl) (meth)acrylamide, or N,N-dimethylaminopropyl (meth)acrylamide.

The reaction between the moisture-reactive organometallic compound and the polymer having a carboxyl group is achieved by mixing. A mixing ratio of both materials is adjusted so that the entire site to be reacted with moisture of the moisture-reactive organometallic compound is not consumed by the carboxyl group of the polymer having a carboxyl group. Specifically, the amount of the moisture-reactive organometallic compound is preferably from 0.05 to 10 mols based on 1 mol of the carboxyl group.

The moisture-reactive composition may also be described as comprising: a moisture-reactive organometallic compound comprising Al, Mg, Zn, Ti or Zr; and a polymer having a molecular weight of from 500 to 5,000,000, the polymer comprising carboxylic acid groups and selected from the group consisting of: (a) an acrylic polymer comprising one or more acrylic monomers selected from the group consisting of (meth)acrylic acid; styrene; α-methylstyrene; 2-ethylhexyl (meth)acrylate; n-octyl (meth)acrylate; lauryl (meth)acrylate; stearyl (meth)acrylate; isobornyl (meth)acrylate; dicyclopentanyl (meth)acrylate; phenoxyethyl (meth)acrylate; polyethylene glycol (meth)acrylate; polypropylene glycol (meth)acrylate; N-methylol (meth)acrylamide; N-methoxymethyl (meth)acrylamide; N-ethoxymethyl (meth)acrylamide; N-n-butoxymethyl (meth)acrylamide; N-isobutoxymethyl (meth)acrylamide; t-butyl (meth)acrylamide; octyl (meth)acrylamide; acryloyl morpholine; N-vinyl pyrrolidone; N,N-dimethyl (meth)acrylamide; N,N-diethyl (meth)acrylamide; N-(2-hydroxyethyl) (meth)acrylamide; and N,N-dimethylaminopropyl (meth)acrylamide; (b) a silicone; (c) a polyether; and (d) a hydrogenated polyolefin.

For example, the polymer comprising carboxylic acid groups may consist essentially of 2-ethylhexyl acrylate and acrylic acid. The polymer comprising carboxylic acid groups may also comprise: polyoxyethylene having terminal carboxyl groups or hydrogenated polybutadiene having terminal carboxyl groups.

The moisture-reactive organometallic compound comprises trimethylaluminum, triethylaluminum, trioctylaluminum, tris(triethylene glycol monobutylether oxy)aluminum, or triisostearyloxy aluminum. The moisture-reactive composition may further comprise silica, titanium oxide, zinc oxide, aluminum oxide, zirconium oxide, or clay. The moisture-reactive composition may be transparent. A moisture-absorbing film formed of the moisture-reactive composition may be formed as described previously.

The composition of the present invention may contain, in addition to the moisture-reactive organometallic compound and the polymer having a carboxyl group, a compound having no carboxyl group and/or a filler so as to adjust the viscosity. As the compound having no carboxyl group, a compound having a structure which is compatible with the polymer having a carboxyl group can be used, and such a polymer can be used as an adhesive because it has tack after curing. Examples of compounds having no carboxyl groups include polydimethylsiloxane or a polymer consisting essentially of 2-ethylhexylacrylate. The filler is preferably an inorganic filler having a hydroxyl group capable of reacting with the moisture-reactive organometallic compound, and examples thereof include silica, titanium oxide, zinc oxide, aluminum oxide, zirconium oxide, and clay. The particle size of the filler can be optionally selected as long as it does not adversely affect transparency of the composition, and is preferably from 1 to 1,000 nm.

The composition of the present invention can be applied as a moisture scavenger in a device such as organic EL device which is likely to be influenced by moisture. The composition is transparent and therefore can be arranged at sides of the light emitting surface and the right receiving surface of the device without intercepting light, and also can efficiently utilize the area of the light emitting portion without providing a display or a solar battery panel with the installation location.

The film formed of the composition of the present invention is transparent and therefore can be used for various optical devices. That is, the second aspect of the present invention relates to a moisture-absorptive film formed of this composition. This film can be formed, for example, by coating the composition on a substrate, followed by drying.

Figure 2:
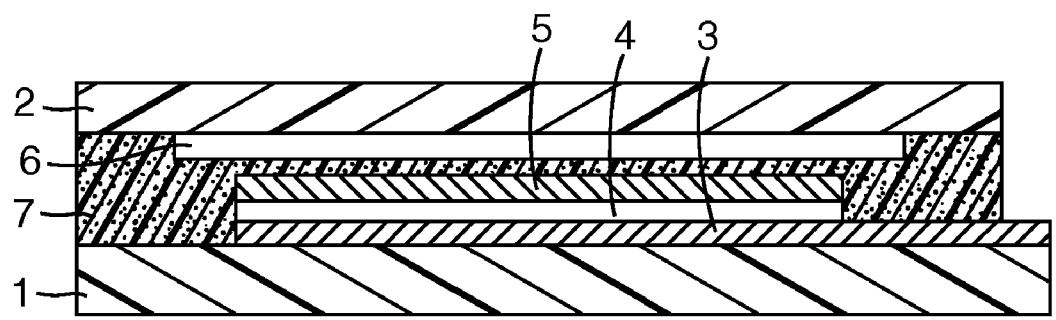
FIGS. 2-5 are sectional views each showing schematically a structure of an organic EL device of the present invention.
Figure 3:
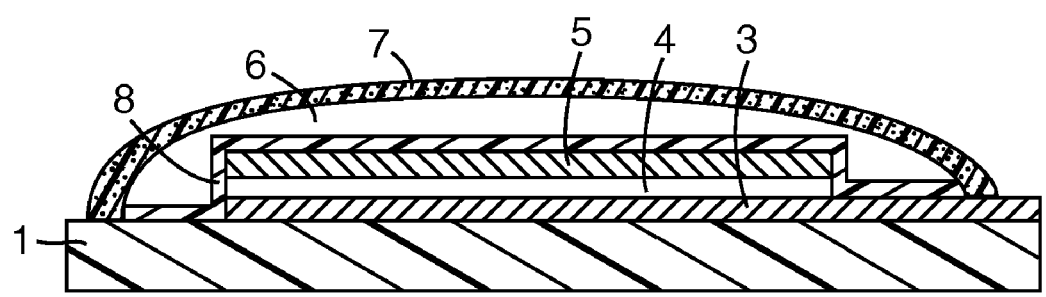

The third aspect of the present invention relates to an organic EL device in which the composition is arranged inside as drying means. This EL device can have the same constitution as that of a conventional organic EL device shown in FIG. 1. That is, the organic EL device disclosed herein comprises a laminate formed by interposing an organic luminescent material layer 4 made of an organic material between a pair of an electrode 3 and an electrode 5 facing each other, a structure 2 which shields the laminate from the outside air, and drying means 6 (water absorbing agent) arranged in the structure, and the drying means is formed of the above moisture-reactive composition. Since this composition is transparent, there is no limitation of the location at which the drying means 6 is arranged. As shown in FIG. 2, it may be directly applied as a film 6 so as to cover the electrode 5. Alternatively, as shown in FIG. 3, this film 6 may be arranged so as to cover the electrodes 3 and 5 and the organic functional layer 4 on the substrate 1, and also the sealing adhesive 7 may be covered thereon. Layer 8 may be a thin film encapsulation layer, a passivation layer, or a protective layer to separate film 6 from contacting 4 and 5.

Figure 4:
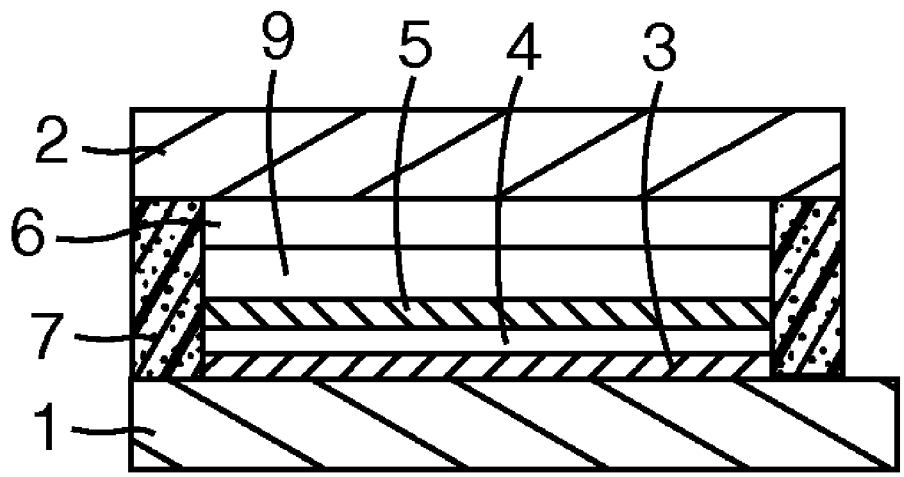
Figure 5:
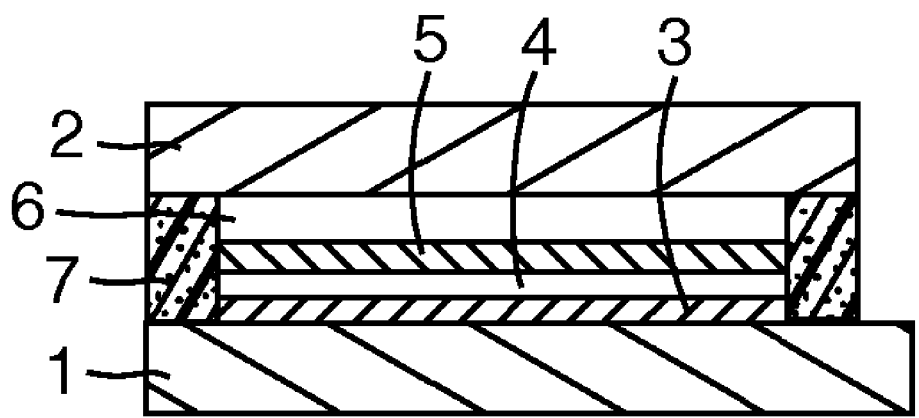

Other exemplary devices include those shown in FIGS. 4 and 5. In FIG. 4, the device is similar to that shown in FIG. 1, except that sealing adhesive 7 is adjacent the laminate on both sides. In FIG. 5, the device is similar to that shown in FIG. 4, except that air gap 9 does not exist between film 6 and electrode 5.

EXAMPLES

Materials

Acrylic resins as shown in Table 1 were synthesized by conventional methods using 2-ethylhexyl acrylate (2-EHA; manufactured by Nippon Shokubai Co., Ltd.) and acrylic acid (AA; manufactured by Wako Pure Chemical Industries, Ltd.).

TABLE 1

| Polymer | Contents (% by weight) | Solid content % in toluene | Mw |
| --- | --- | --- | --- |
| Polymer 1 | 2-EHA/AA = 99.9/0.01 | 40 | 100,000 |
| Polymer 2 | 2-EHA/AA = 99.9/0.01 | 40 | 200,000 |
| Polymer 3 | 2-EHA = 100 | 40 | 100,000 |

The following materials were commercially available products and were purchased and used as received:

Polymer 4: Shin-Etsu Silicones Co., Ltd., X-22-162C, COOH group-terminated block silicone;

Polymer 5: Shin-Etsu Silicones Co., Ltd., X-22-3701E, COOH group side chain-containing block silicone;

Polymer 6: Sigma Aldrich Co., Ltd. Co., polyoxyethylene, COOH group-terminated block, Mw: 600;

Polymer 7: Nippon Soda Co., Ltd. Co., COOH group-terminated hydrogenated polybutadiene, Mw: 1,000;

Polymer 8: GE Toshiba Silicones Co., Ltd. Co., TSE200, polydimethylsiloxane, Mw: 2,000,000;

Compound 1: trioctyl aluminum, Sigma Aldrich Co., Ltd.;

Compound 2: tris(triethylene glycol monobutylether oxy) aluminum;

Compound 3: triisostearyloxy aluminum; and

Compound 4: Liquid Oliepe AOO, aluminum oxide octylate, Hope Chemical Co., Ltd.

Example 1

All reagents and solvents were commercially available products and were purchased and used as received. In a 20 mL nitrogen-substituted screw tube, a hexane solution (solid content: 25% by weight) of 4.0 g of trioctylaluminum (manufactured by Sigma Aldrich Co.) was charged and a toluene solution (solid content: 40% by weight) of 10.0 g of Polymer 1 was added, followed by vigorous stirring to obtain a solution composition.

Examples 2 to 7

In the same manner as in Example 1, solution compositions were obtained using materials shown in Table 2.

Comparative Examples 1 and 2

In the same manner as in Example 1, solution compositions were obtained using materials shown in Table 2.

TABLE 2

| Ex. | Polymer | wt. % | Compound | wt. % |
|---|---|---|---|---|
| 1 | 1 | 80 | 1 | 20 |
| 2 | 2 | 80 | 1 | 20 |
| 3 | 2 | 40 | 3 | 60 |
| 4 | 4 | 33 | 1 | 34 |
|   | 8 | 33 |   |   |
| 5 | 5 | 6 | 1 | 47 |
|   | 8 | 47 |   |   |
| 6 | 6 | 20 | 2 | 80 |
| 7 | 3 | 75 | 1 | 20 |
|   | 7 | 5 |   |   |
| C-1 | none | — | 4 | 100 |
| C-2 | 3 | 80 | 1 | 20 |

Measurement of Moisture Absorption Properties

Each of the above solution compositions was coated on commercially available polyethylene terephthalate (PET) film (LUMIRROR T-60, thickness: 50 μm, manufactured by Toray Industries, Inc.) under a nitrogen atmosphere using a knife coater. After drying, each of the resulting films had a thickness of 50 μm. The films thus obtained were cut into pieces measuring 30 mm×40 mm, put in a glass bottle having a volume of 420 mL, and then a metal cap with a thermometer and a hygrometer (testo Co., 605-Hi) was closed. The time until the relative humidity in the glass bottle decreased to 10% and the relative humidity after 12 hours were measured. The measurement results are shown in Table 3.

Measurement of Transmission Properties

Using Spectrophotometer U-4000 manufactured by Hitachi, Ltd., transmittance was measured. The 50 μm thick films formed by the above method were sufficiently cured by standing in air at relative humidity of 50% and 25° C. for 3 days, and then used as samples for measurement. In the analysis, the PET film was employed as a base line. A minimum transmittance at a wavelength within a range from 400 to 800 nm is shown in Table 3.

Measurement of Flexibility

The films used in the above test were bent around an iron bar (R=10 mm) and visually observed. This operation was repeated 10 times. As shown in Table 3, cracking was not observed on the surface of the films of Examples 1 to 7.

TABLE 3

| Example | Time up to 10% reduction | Transparency | Frequency of Bending |
|---|---|---|---|
| 1 | 12 min | 98% | >10 |
| 2 | 10 min | 97% | >10 |
| 3 | 18 min | 98% | >10 |
| 4 | 18 min | 92% | >10 |
| 5 | 10 min | 92% | >10 |
| 6 | 15 min | 95% | >10 |
| 7 | 15 min | 95% | >10 |
| C-1 | 12 min | cracking occurred | fractured after one bending |
| C-2 | 15 min | whitening occurred | >10 |

As is apparent from the results shown in Table 3, the compositions of Examples 1 to 7 have sufficient moisture curability and can be used as a moisture scavenger. Also films formed of these compositions have sufficient flexibility. Furthermore, these films have sufficient transparency in the visible light range. On the other hand, the composition of Comparative Example 1 was very brittle after moisture absorption and it was difficult to bend. The composition of Comparative Example 2 was transparent immediately after coating and whitening occurred after standing for 12 hours.

What is claimed is:

1. A moisture-reactive composition comprising:
   a moisture-reactive organometallic compound comprising Al, Mg, Zn, Ti or Zr; and
   a polyoxyethylene polymer having terminal carboxyl groups and a molecular weight of from 500 to 5,000,000.

2. The moisture-reactive composition according to claim 1, wherein the moisture-reactive organometallic compound comprises trimethylaluminum, triethylaluminum, trioctylaluminum, tris(triethylene glycol monobutylether oxy)aluminum, or triisostearyloxy aluminum.

3. The moisture-reactive composition according to claim 1, wherein the composition further comprises silica, titanium oxide, zinc oxide, aluminum oxide, zirconium oxide, or clay.

4. The moisture-reactive composition according to claim 1, wherein the composition further comprises a compound having no hydroxyl groups.

5. The moisture-reactive composition according to claim 4, wherein the compound having no, hydroxyl group comprises polydimethylsiloxane or a polymer consisting essentially of 2-ethylhexylacrylate.

6. The moisture-reactive composition according to claim 1, wherein the composition is transparent.

7. A moisture-absorbing film formed of the moisture-reactive composition according to claim 1.

8. A moisture-absorbing film formed of the moisture-reactive composition according to claim 1, wherein the moisture-absorbing film has a frequency of bending of greater than 10.

9. An organic electroluminescent device comprising:
a laminate comprising an organic luminescent material layer made of an organic material interposed between a pair of electrodes facing each other;
a structure which shields the laminate from the outside air; and
a moisture-reactive composition disposed within the structure, the moisture-reactive composition according to claim 1.

10. The organic electroluminescent device of claim 9, wherein the moisture-reactive composition covers one of the electrodes.

11. The organic electroluminescent device of claim 9, further comprising an adhesive, wherein the moisture-reactive composition and the adhesive cover the laminate.

12. A moisture-reactive composition comprising:
a moisture-reactive organometallic compound comprising Al, Mg, Zn, Ti or Zr; and
an acrylic polymer having a molecular weight of from 500 to 5,000,000 and consisting essentially of 2-ethylhexyl acrylate and acrylic acid.

13. The moisture-reactive composition according to claim 12, wherein the moisture-reactive organometallic compound comprises trimethylaluminum, triethylaluminum, trioctylaluminum, tris(triethylene glycol monobutylether oxy)aluminum, or triisostearyloxy aluminum.

14. The moisture-reactive composition according to claim 12, wherein the composition further comprises silica, titanium oxide, zinc oxide, aluminum oxide, zirconium oxide, or clay.

15. The moisture-reactive composition according to claim 12, wherein the composition further comprises a compound having no hydroxyl groups.

16. The moisture-reactive composition according to claim 15, wherein the compound having no hydroxyl group comprises polydimethylsiloxane or a polymer consisting essentially of 2-ethylhexylacrylate.

17. The moisture-reactive composition according to claim 12, wherein the composition is transparent.

18. A moisture-absorbing film formed of the moisture-reactive composition according to claim 12.

19. A moisture-absorbing film formed of the moisture-reactive composition according to claim 12, wherein the moisture-absorbing film has a frequency of bending of greater than 10.

20. An organic electroluminescent device comprising:
a laminate comprising an organic luminescent material layer made of an organic material interposed between a pair of electrodes facing each other;
a structure which shields the laminate from the outside air; and
a moisture-reactive composition disposed within the structure, the moisture-reactive composition according to claim 12.

21. The organic electroluminescent device of claim 20, wherein the moisture-reactive composition covers one of the electrodes.

22. The organic electroluminescent device of claim 20, further comprising an adhesive, wherein the moisture-reactive composition and the adhesive cover the laminate.

* * * * *

UNITED STATES PATENT AND TRADEMARK OFFICE
CERTIFICATE OF CORRECTION

| | | |
|---|---|---|
| PATENT NO. | : 8,206,841 B2 | Page 1 of 1 |
| APPLICATION NO. | : 12/374096 | |
| DATED | : June 26, 2012 | |
| INVENTOR(S) | : Jun Fujita | |

It is certified that error appears in the above-identified patent and that said Letters Patent is hereby corrected as shown below:

Column 1
Line 4; Below "Title" insert -- CROSS REFERENCE TO RELATED APPLICATIONS
This application is a national stage filing under 35 U.S.C. § 371 of PCT/US2007/076946, filed August 28, 2007 which claims priority to Japanese Application No. 2006-235590, filed August 31, 2006, the disclosure of which is incorporated by reference in its/their entirety herein. --.

Column 4
Line 42; Delete "(GCP)." and insert -- (GPC). --, therefor.

Column 7
Line 64; Delete "605-Hi)" and insert -- 605-H1) --.

Column 8
Line 61; Claim 5, delete "no," and insert -- no --, therefor.

Signed and Sealed this
Second Day of April, 2013

Teresa Stanek Rea
*Acting Director of the United States Patent and Trademark Office*